(12) United States Patent
Niu et al.

(10) Patent No.: US 6,277,751 B1
(45) Date of Patent: *Aug. 21, 2001

(54) METHOD OF PLANARIZATION

(75) Inventors: Pao-Kang Niu, Hsinchu; Chang-Sheng Lee, Taipei; Bih-Tiao Lin, Ping-Tung Hsien; Sen-Nan Lee, Hsinchu, all of (TW)

(73) Assignee: Worldwide Semiconductor Manufacturing Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,749

(22) Filed: Feb. 9, 1999

(30) Foreign Application Priority Data

Nov. 16, 1998 (TW) .................................. 87118921

(51) Int. Cl.$^7$ ..................................... H01L 21/302
(52) U.S. Cl. ........................... 438/692; 438/694; 438/697
(58) Field of Search ..................... 438/692, 694, 438/697, 745, 747, 754, 756, 760, 780, 781, 782

(56) References Cited

U.S. PATENT DOCUMENTS

| | | | |
|---|---|---|---|
| 5,302,233 | 4/1994 | Kim et al. ............................ | 438/692 |
| 5,312,512 | 5/1994 | Allman et al. ....................... | 438/624 |
| 5,503,882 | * 8/1996 | Dawson ................................ | 438/763 |
| 5,532,191 | 7/1996 | Nakano et al. ...................... | 438/692 |
| 5,654,216 | * 8/1997 | Adrian ................................. | 438/627 |
| 5,674,784 | 10/1997 | Jang et al. ........................... | 438/692 |
| 5,679,610 | 10/1997 | Matsuda et al. ..................... | 438/584 |
| 5,705,028 | 1/1998 | Matsumoto ......................... | 438/623 |
| 5,705,435 | 1/1998 | Chen .................................... | 438/8 |

* cited by examiner

Primary Examiner—Benjamin L. Utech
Assistant Examiner—Binh X. Tran
(74) Attorney, Agent, or Firm—Thomas, Kayden, Horstemeyer & Risley, LLP

(57) ABSTRACT

A method for planarizing a semiconductor wafer. An insulation layer is formed over the wafer. A spin-on-glass layer is coated over the insulation layer. Subsequently, the spin-on-glass layer is baked to smooth out its upper surface. A chemical-mechanical polishing process is carried out to planarize the insulation layer. The method eliminates recess cavities in the more loosely packed device region of the insulation layer after a planarization process.

9 Claims, 3 Drawing Sheets

METHOD OF PLANARIZATION

CROSS-REFERENCE TO RELATED APPLICATION

This application claims the priority benefit of Taiwan application Ser. No. 87118921, filed Nov. 16, 1998, the full disclosure of which is incorporated herein by reference.

BACKGROUND OF THE INVENTION

1. Field of Invention

The present invention relates to a method of planarization. More particularly, the present invention relates to a method including the step of forming a spin-on-glass (SOG) layer over a semiconductor wafer prior to performing a chemical-mechanical polishing process, so that a smooth polished wafer surface is obtained.

2. Description of Related Art

In the fabrication of VLSI or ULSI circuits, all the devices, metallic interconnects or isolating trench structures on a semiconductor wafer must be carefully laid out so that the level of device integration and operating speed are optimized. However, these devices and structures are likely to be distributed non-uniformly above the semiconductor wafer. Consequently, a portion of the wafer surface will be densely packed while some other areas may have very few devices or isolating structures. Furthermore, all these devices and structures have different thicknesses. Hence, the wafer is likely to have a highly undulating cross-sectional profile. To facilitate the next processing process, the semiconductor wafer is usually planarized.

At present, the most commonly used method of planarizing a semiconductor wafer is the chemical-mechanical polishing (CMP) method. In a CMP process, chemical agents in the form of slurry are delivered to a rotating polishing table with a polishing pad on top. With the back of a wafer grasped by a handle, a global polishing of the wafer is carried out by pressing the front surface against the polishing pad though the handle. Since the polishing pad is made from a soft, flannel-like material, the pad is able to follow the varying contour of the wafer surface.

Because devices and structures are not evenly distributed on the surface of the semiconductor wafer, some areas are densely packed while other areas are loosely packed. Therefore, when an insulation layer is deposited over the semiconductor wafer, the insulating material will accumulate to a higher level in the densely packed areas than in the loosely packed areas. Subsequently, if a chemical-mechanical polishing process is carried out to planarize the wafer surface, recess cavities can easily form in the loosely packed device areas. Hence, a completely planarized semiconductor wafer surface is difficult to obtain.

FIGS. 1A through 1C are schematic, cross-sectional views showing the progression of steps according to a conventional method of planarizing an insulation layer above a semiconductor wafer.

First, as shown in FIG. 1A, a semiconductor wafer 100 having a densely packed device region 108 and a loosely packed device region 110 thereon is provided. Next, an insulation layer 102 is formed over the substrate 100 in both regions 108 and 110. The insulation layer can be formed by performing a chemical vapor deposition (CVD) process. The insulating material of the insulation layer 102 accumulates to a higher level in the densely packed device region 108 than in the loosely packed device region 110. Hence, the upper surface of the insulation layer 102 has a highly undulating profile.

Next, as shown in FIG. 1B, a chemical-mechanical polishing (CMP) process is carried out to planarize the semiconductor wafer 100. Due to the relative softness of the polishing pad 104, the polishing pad 104 is able to contact the upper surface of the insulation layer 102 in the loosely packed region 110 more closely than the densely packed region 108.

Thereafter, as shown in FIG. 1C, a recess cavity 106 is formed in the loosely packed device region 110 so that a not-so-planar insulating layer 102 results. Consequently, when material is deposited over the wafer, thickness tends to vary across the surface. Additionally, when the wafer is subsequently etched, depth of etching will tends to vary across the surface, too. Hence, more defects accumulate on the wafer and failure rate of the devices within the wafer is higher.

In light of the foregoing, there is a need to provide an improve method for planarizing a semiconductor wafer.

SUMMARY OF THE INVENTION

Accordingly, the purpose of the present invention is to provide a method for planarizing a semiconductor wafer by preventing the formation of recess cavities above the loosely packed device areas of an insulation layer after performing a chemical-mechanical polishing process.

To achieve these and other advantages and in accordance with the purpose of the invention, as embodied and broadly described herein, the invention provides a method for planarizing a semiconductor wafer to prevent the formation of recess cavity in loosely packed device areas above an insulation layer. An insulation layer over a semiconductor wafer having a pre-defined upper profile is formed over a substrate. The upper profile of the semiconductor wafer is formed due to the formation of semiconductor devices, metallic interconnects, and trench structures above the substrate. Furthermore, the profile can be further divided into densely packed and loosely packed device regions. The insulation layer accumulates to a higher level in the densely packed region than in the loosely packed region. A spin-on-glass (SOG) layer is spin-coated over the insulation layer. A baking process is carried out to remove volatile organic solvent inside the SOG layer. A chemical-mechanical polishing process is conducted to planarize the wafer. The entire SOG layer is removed, retaining only an insulation layer polished to the expected thickness.

One major aspect of this invention is the coating of a spin-on-glass layer over the insulation layer prior to the carrying out of a planarization process. Spin-on-glass is highly flowable, and hence is able to form a very smooth planar surface. After the spin-on-glass material is baked, the spin-on-glass layer is planarized by performing a chemical-mechanical polishing process. The problem of having too many recess cavities in the loosely packed device region above the insulation layer is avoided.

Another aspect of this invention is that the curing process for solidifying the spin-on-glass layer is omitted. In other words, only the spin-coating process for forming a spin-on-glass layer over the insulation layer and its subsequent baking process are performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
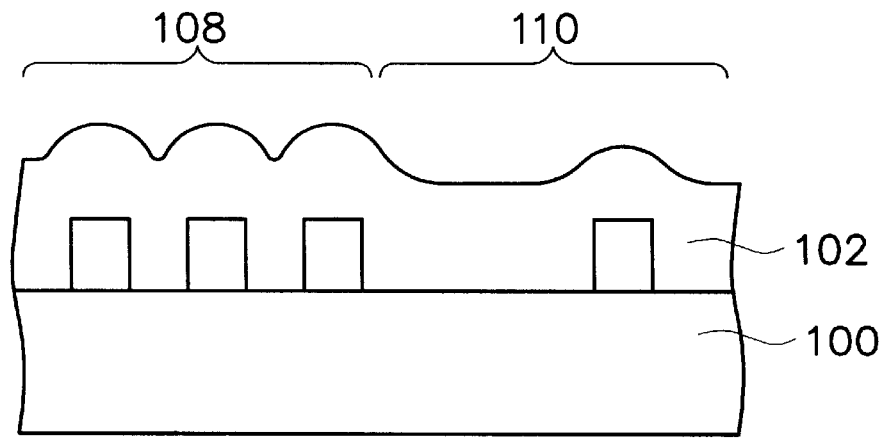
FIGS. 1A through 1C are schematic, cross-sectional views showing the progression of steps according to a conventional method of planarizing an insulation layer above a semiconductor wafer.
Figure 1B:
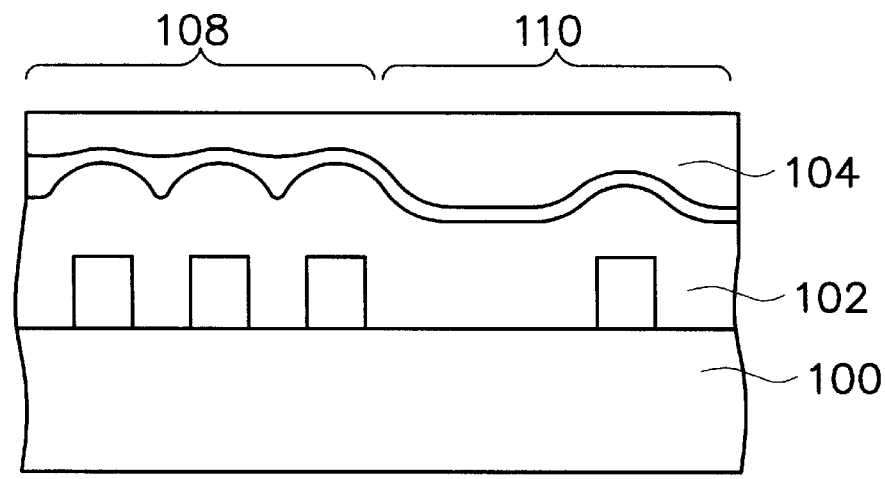
Figure 1C:
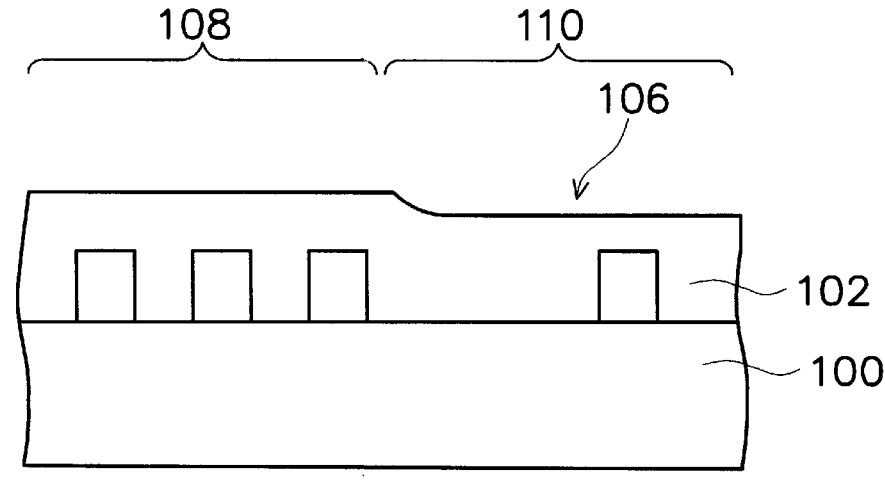

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing the progression of steps for planarizing the upper surface of an insulating layer without forming recess cavities in the loosely packed region according to one preferred embodiment of this invention.

Figure 2A:
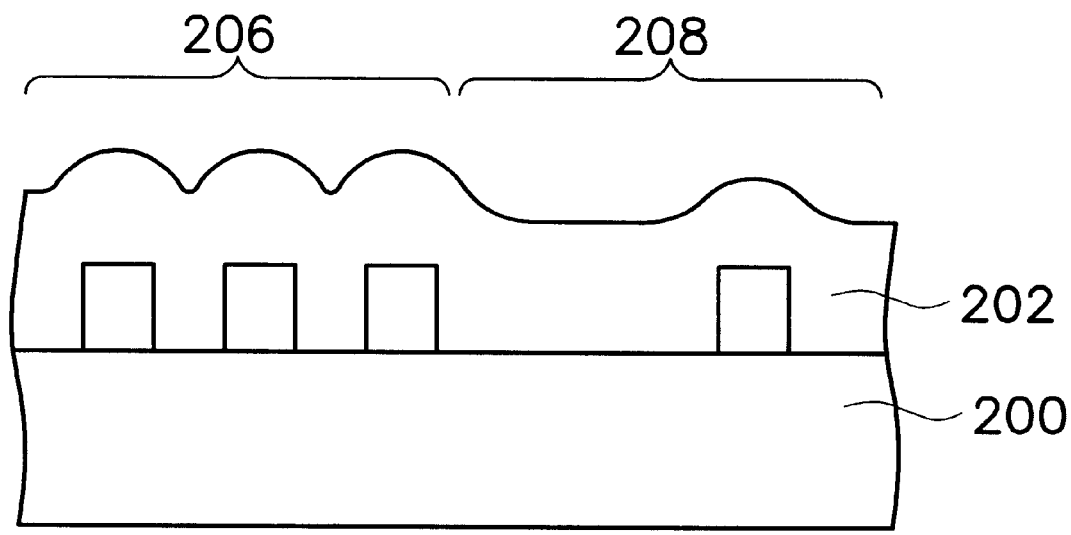
FIGS. 2A through 2D are schematic, cross-sectional views showing the progression of steps for planarizing the upper surface of an insulating layer without forming recess cavities in the loosely packed region according to one preferred embodiment of this invention.

As shown in FIG. 2A, a semiconductor wafer 200 having a pre-defined surface profile is provided. The pre-defined surface profile arises from substrate, semiconductor devices, metallic interconnects and the trench structures of isolating devices formed above the wafer. Furthermore, the pre-defined surface profile can be divided into densely packed device regions 206 and loosely packed device regions 208. An insulation layer 202 is formed over the semiconductor wafer 200 using, for example, a chemical vapor deposition (CVD) method. The upper surface of the insulation layer 202 has a profile similar to the semiconductor wafer 200. In other words, the insulation layer 202 rises to a higher level in the densely packed regions 206 than in the loosely packed regions 208.

Figure 2B:
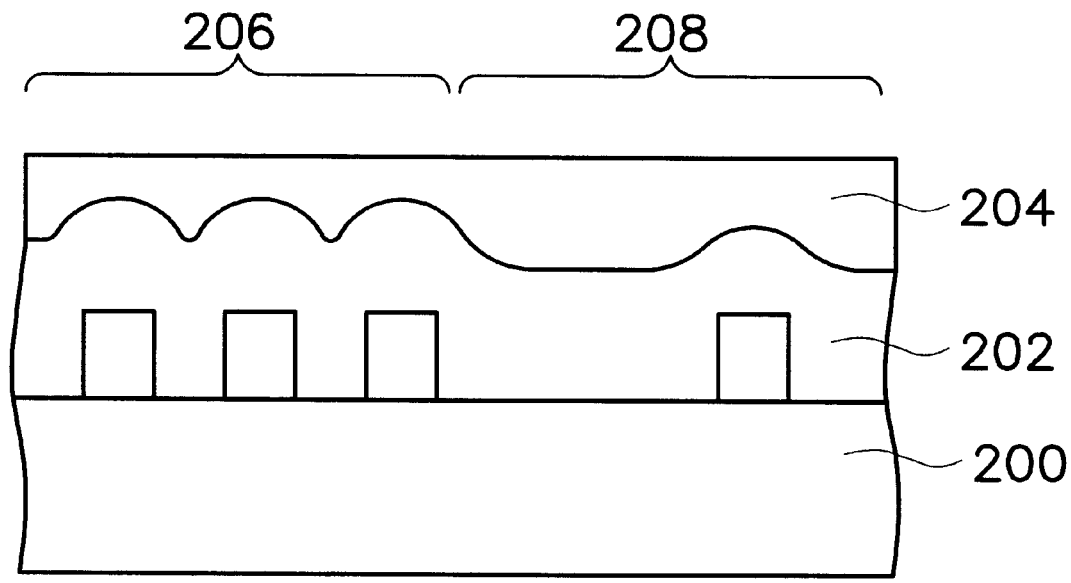

As shown in FIG. 2B, a spin-on-glass (SOG) layer 204 is spin-coated over the insulation layer 202. Due to the flowability of the SOG material, a very flat upper surface will be obtained.

Figure 2C:
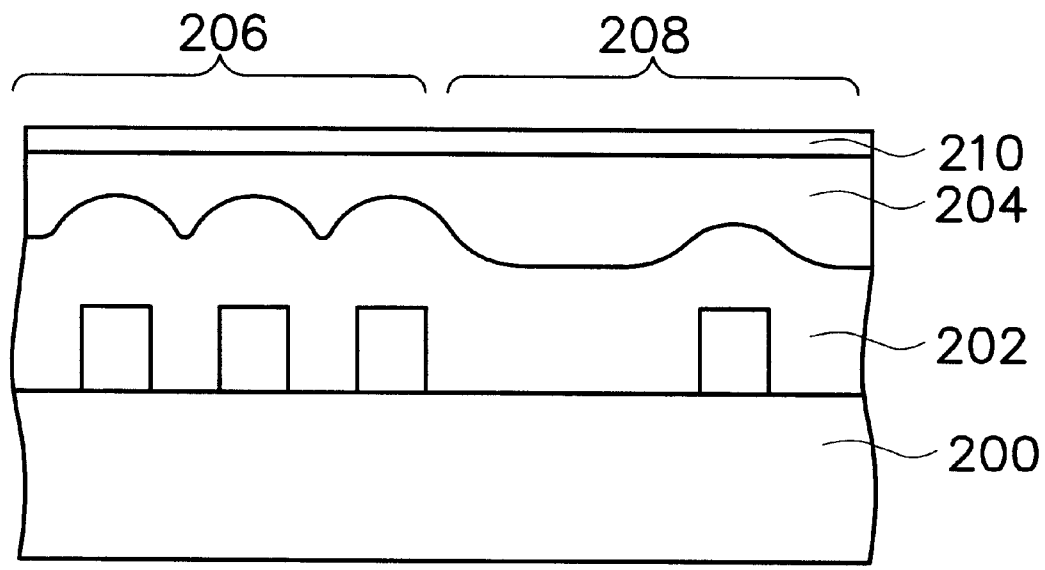

As shown in FIG. 2C, a baking process is carried out at a temperature of between 100° C. and 170° C. so that volatile organic solvent inside the SOG layer 204 can be evaporated away. The SOG layer 204 is hardened. At the same time, the SOG layer 204 contracts a little along the upper surface of the insulation layer 202. However, the degree of contraction is not much so that surface profile of the insulation layer 202 does not emerge again at the top of the SOG layer 204. Consequently, the baked SOG layer 204 can still maintain a high degree of planarity at its upper surface. Nevertheless, baking of the SOG layer 204 must not be carried out for too long, otherwise the SOG material will be transformed into an oxide layer, which is ineffective for forming a planar surface.

In a conventional SOG planarization process, the SOG layer is cured after the baking process. Curing is a process of solidifying the SOG material into silicon dioxide ($SiO_2$) so that the SOG layer is hardened. However, in this invention, curing is not carried out. Curing results in a rather large contraction of the SOG layer 204, and hence the upper surface profile of the insulation layer 202 would ultimately emerge on the upper surface of the SOG layer 204. If a chemical-mechanical polishing process were carried out, the polishing pad 204 within the loosely packed region 208 would follow the upper profile of the SOG layer 204. Hence, recess cavities would likely form in the upper surface of the insulation layer 202 in the loosely packed region 208.

Figure 2D:
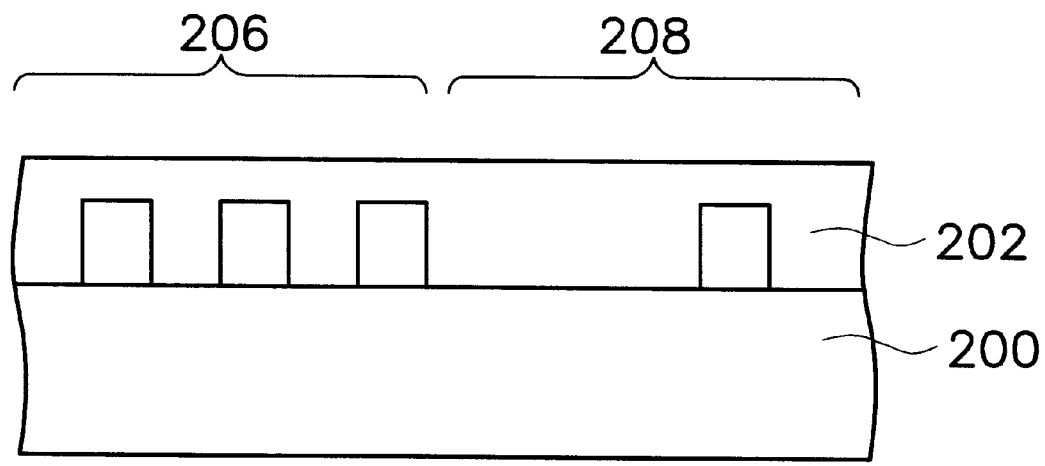

As shown in FIG. 2D, a chemical-mechanical polishing (CMP) method is used to remove the SOG layer 204 and planarize the insulation layer 202. Hence, an insulation layer having a thickness as specifically required and a planar upper surface is obtained. Since the SOG layer 204 with which the polishing pad 210 makes contact during the CMP process is flat, recess cavities do not form on the insulation layer 202 in the loosely packed region 208.

In summary, this invention includes coating a spin-on-glass layer 204 over the insulation layer 202. The SOG layer 204 is only baked to transform the highly undulating surface profile of the insulation layer 202 into a much smoother surface. Although the insulation layer 202 is higher in the densely packed regions 206 than in the loosely packed regions 208, the flowable property of the SOG material permits an equalization of the height difference between the two regions. Hence, when a chemical-mechanical polishing process is later carried out, the polishing pad 210 will be in contact with a flat surface. Consequently, unlike in a conventional method, no recess cavity such as 106 is formed on the insulation layer 102 in the loosely packed region 110. The central idea behind this invention is to provide a planar surface above the insulation layer 202 of a semiconductor wafer 200 so that subsequent processing processss above the insulation layer 202 can have better effects. In other words, the invention is able to prevent the generation of undesirable defects resulting from a non-planar surface, thereby increasing the product yield and lowering wafer production cost.

Furthermore, this invention includes another advantage that a curing step of the SOG layer 204 above the insulation layer 202 is not conducted after the baking process. This is because curing makes the SOG layer 204 contract. Contraction of the SOG layer 204 eliminates the positive effect of leveling the height difference between the insulation layer 202 in the densely packed region 206 and the loosely packed region 208. Hence, when a chemical-mechanical polishing process is later carried out, height difference between the densely packed region 206 and the loosely packed region 208 again produces recess cavities on the insulation layer 202.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for planarization, comprising the steps of:
   providing a semiconductor wafer;
   forming an insulation layer over the semiconductor wafer;
   coating a spin-on-glass layer over the insulation layer;
   baking the spin-on-glass layer at a temperature between about 100 and about 170 degrees Celsius;
   planarizing the wafer surface by performing a chemical-mechanical polishing process, wherein no curing process is performed on the spin-on-glass layer during any part of the method for planarization.

2. The method of claim 1, wherein the step of forming the insulation layer includes depositing silicon dioxide to form an oxide layer.

3. The method of claim 1, wherein the step of planarizing the insulation using a chemical-mechanical polishing method includes completely removing the spin-on-glass layer as well as a portion of the insulation layer.

4. A planarization method that can be applied to planarize a semiconductor wafer having a densely packed device region and loosely packed device region, comprising the steps of:

forming an insulation layer over the semiconductor wafer;

coating a spin-on-glass layer over the insulation layer;

baking the spin-on-glass layer at a temperature between about 100 and about 170 degrees Celsius; and planarizing the wafer surface using a chemical-mechanical polishing method, wherein no curing process is performed on the spin-on-glass layer during any part of the method for planarization.

5. The method of claim 4, wherein the densely packed device regions and the loosely packed device regions both contain metallic interconnects.

6. The method of claim 4, wherein the densely packed device regions and the loosely packed device regions both contain trenches.

7. The method of claim 4, wherein the step of forming the insulation layer includes depositing silicon dioxide to form an oxide layer.

8. The method of claim 4, wherein the step of planarizing the insulation using a chemical-mechanical polishing method includes completely removing the spin-on-glass layer as well as a portion of the insulation layer.

9. A planarization method, comprising the steps of:

providing a semiconductor wafer;

forming an insulation layer over the semiconductor wafer;

coating a spin-on-glass layer over the insulation layer;

baking the spin-on-glass layer, wherein after baking the spin-on-glass layer;

planarizing the wafer surface by performing a chemical-mechanical polishing process, wherein no curing process is performed on the spin-on-glass layer during any part of the method for planarization.

* * * * *